United States Patent [19]

Hayward et al.

[11] Patent Number: 5,068,621
[45] Date of Patent: Nov. 26, 1991

[54] COMPENSATION METHOD AND APPARATUS FOR ENHANCING SINGLE ENDED TO DIFFERENTIAL CONVERSION

[75] Inventors: Wesley H. Hayward; Stewart S. Taylor, both of Beaverton, Oreg.

[73] Assignee: TriQuint Semiconductor, Inc., Beaverton, Oreg.

[21] Appl. No.: 566,904

[22] Filed: Aug. 13, 1990

[51] Int. Cl.[5] .............................................. H03F 3/45
[52] U.S. Cl. .................................... 330/253; 330/261; 330/301
[58] Field of Search ................. 330/253, 261, 275, 301

[56] References Cited

U.S. PATENT DOCUMENTS

4,612,513 9/1986 Seevinch ............................ 330/261

Primary Examiner—James B. Mullins
Attorney, Agent, or Firm—Marger, Johnson, McCollom & Stolowitz, Inc.

[57] ABSTRACT

A compensation method and apparatus for enhancing single-ended to differential conversion includes a compensation network that is coupled between the single-ended voltage input and the bias terminal of a differential stage. The compensation network has an impedance substantially equal to the impedance presented by the bias circuit used to bias the differential stage. Accordingly, the compensation network provides a current that substantially cancels the signal tail current supplied to the bias terminal of the differential stage, resulting in a balanced differential output. The compensation network may be AC coupled from the single-ended voltage input to the bias terminal in order to preserve the original DC operating condition. The compensation network may be chosen to provide more cancelling current at higher operating frequencies. Additionally, the compensation network can be configured to match a bias circuit built from resistors, transistors, current mirrors, or the like.

35 Claims, 8 Drawing Sheets

COMPENSATION METHOD AND APPARATUS FOR ENHANCING SINGLE ENDED TO DIFFERENTIAL CONVERSION

BACKGROUND OF THE INVENTION

Figure 1:
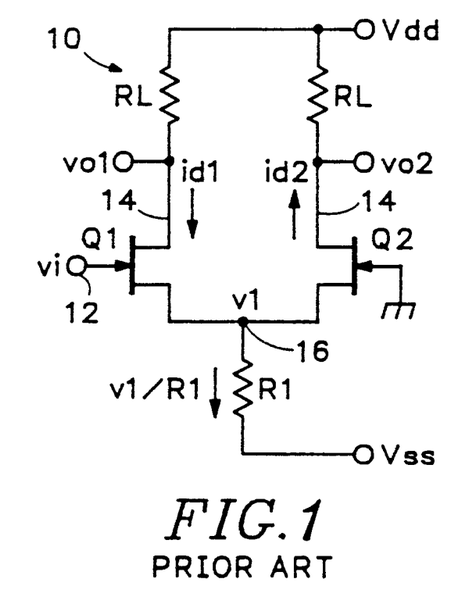
FIG. 1 is a schematic diagram of a prior art single-ended to differential amplifier.

This invention relates generally to differential amplifiers having a single-ended voltage input and a differential current output, and more specifically to a method and apparatus for improving the balance of the differential output. A prior art amplifier 10 for converting a single-ended voltage into a differential current is shown in FIG. 1. This amplifier includes a differential stage (Q1, Q2), a single-ended voltage input 12 for receiving a single-ended voltage vi, a differential current output 14, and a bias terminal 16 for receiving a bias tail current. Load resistors RL coupled to the positive power supply Vdd are provided for converting the differential current output 14 into a differential voltage (vo1, vo2). A bias circuit such as resistor R1 coupled to the negative supply voltage Vss supplies the bias tail current to the bias terminal 16 of the differential stage. Alternatively, R1 may model the output resistance of a current source circuit that provides the bias tail current to the differential amplifier. The incremental voltage at bias terminal 16 is designated v1 and is typically equal to one half of the input voltage vi at signal frequencies. However, since resistor R1 has a finite output impedance, an associated undesirable signal tail current equal to v1/R1 flows out of the differential stage (Q1, Q2).

Figure 1A:
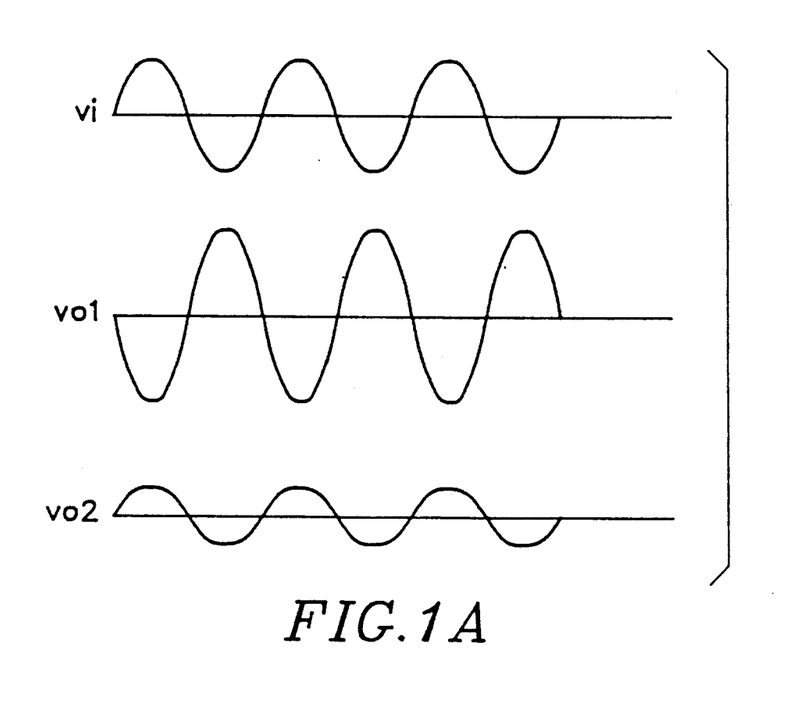
FIG. 1A is a graph illustrating an unbalanced differential output.

The effect of the signal tail current is shown in FIG. 1A. The single-ended voltage vi is shown as a sine wave. The two single-ended components of the differential output voltage vo1 and vo2 are shown as inverted and noninverted voltage outputs, respectively. In an ideal amplifier, the drain currents id1 and id2 that constitute the single-ended components of the differential current output 14 are equal. Therefore, the magnitudes of voltage components vo1 and vo2 are equal. However, the signal tail current adds to drain current id1 and subtracts from id2, as shown in the corresponding vo1 and vo2 waveforms, making the magnitudes unequal.

The unbalanced differential output is particularly noticeable in amplifiers constructed with short channel FET transistors such as GaAs FETs (field effect transistors). In a GaAs differential amplifier it is difficult to implement a high impedance bias tail current, particularly when using small power supplies. In many cases, biasing resistors are used instead as shown in FIG. 1 since the associated voltage drop is low. In this case the undesirable signal tail current increases as the value of the biasing resistor decreases.

The problem caused by the unbalanced differential output in the prior art amplifiers is that signal quality in subsequent signal processing stages may be adversely affected. For example, as one of the output voltage components diminishes, subsequent logic stages may fail to switch. Conversely, as the other of the output voltage components increases, subsequent amplifier stages may saturate, causing distortion. Many RF circuits such as mixers require highly balanced differential signals for proper operation. The imbalance in the output typically increases with frequency because of the parasitic capacitance at bias terminal 16, resulting in even greater signal degradation.

What is desired is a compensation method and apparatus for single-ended to differential amplifiers that improves the balance in the differential output.

SUMMARY OF THE INVENTION

The present invention is a compensation method and apparatus for enhancing single-ended to differential conversion that includes a compensation network coupled between the single-ended voltage input and the bias terminal of a differential stage. The compensation network has an impedance substantially equal to the impedance presented by the bias circuit used to bias the differential stage. Accordingly, the compensation network provides a current that substantially cancels the signal tail current supplied to the bias terminal of the differential stage, resulting in a balanced differential output. The compensation network can be AC coupled from the single-ended voltage input to the bias terminal in order to preserve the original DC operating condition. The compensation network can be chosen to provide more cancelling current at higher operating frequencies. Additionally, the compensation network can be configured to match a bias circuit built from resistors, transistors, current mirrors, or the like.

The foregoing and other objects, features and advantages of the invention will become more readily apparent from the following detailed description of a preferred embodiment which proceeds with reference to the drawings.

DETAILED DESCRIPTION OF A PREFERRED EMBODIMENT

Figure 2:
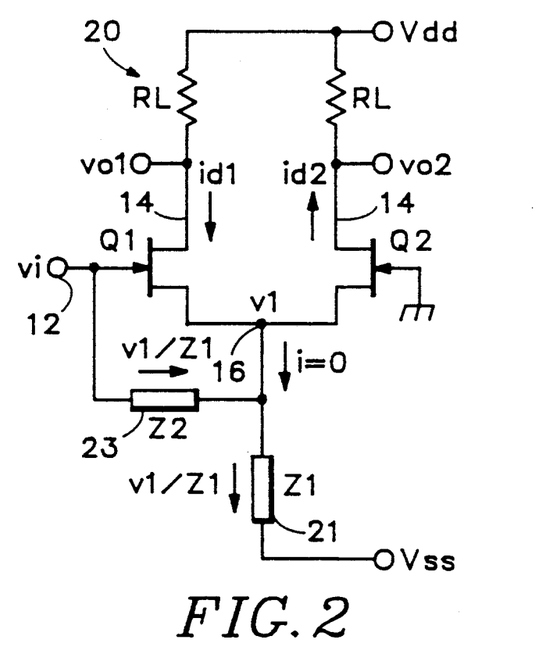
FIG. 2 is a schematic diagram of a balanced single-ended to differential amplifier using the compensation apparatus according to the present invention.

Referring now to FIG. 2, a single-ended to differential amplifier 20 according to the present invention includes a differential stage Q1, Q2 having a single-ended voltage input 12, a differential current output 14, and a bias circuit 21 with an output impedance of Z1 coupled to bias terminal 16. The output impedance creates an undesirable signal tail current having a value of v1/Z1. A compensation network 23 having an impedance Z2 for cancelling the signal tail current is coupled from the single-ended input 12 to the bias terminal 16 of the differential stage (Q1, Q2). At signal frequencies, the voltage v1 at bias terminal 16, is approximately half of the single-ended input voltage vi at terminal 12. Alternatively, voltage vi is equal to approximately two times v1. The current that flows through the compensation impedance Z2 is equal to the voltage vi divided by the quantity two times the impedance Z1. If impedances Z1 and Z2 are substantially equal, the currents through circuits 21 and 23 will be substantially equal. Since the signal current flowing into terminal 16 from impedance Z2 is equal to the signal tail current flowing out of terminal 16 into impedance Z1, the current i flowing from the sources of transistors Q1 and Q2 toward impedances Z1 and Z2 is zero. Therefore, the differential currents id1 and id2 are of equal magnitude and opposite sign and provide a balanced differential output.

To maintain the proper DC bias tail current provided by impedance Z1 prior to the coupling of compensation impedance Z2, a DC blocking capacitor may be coupled between compensation impedance Z2 and the single-ended input 12 or the bias terminal 16. Alternatively, any DC current flowing through compensation impedance Z2 should be considered in the design of the amplifier.

Figure 3:
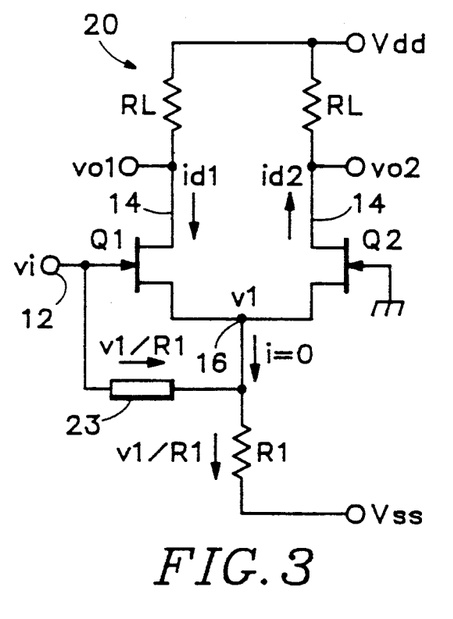
FIGS. 3-14 are schematic diagrams of alternative embodiments of a balanced single-ended to differential amplifier using the compensation apparatus of the present invention.
Figure 4:
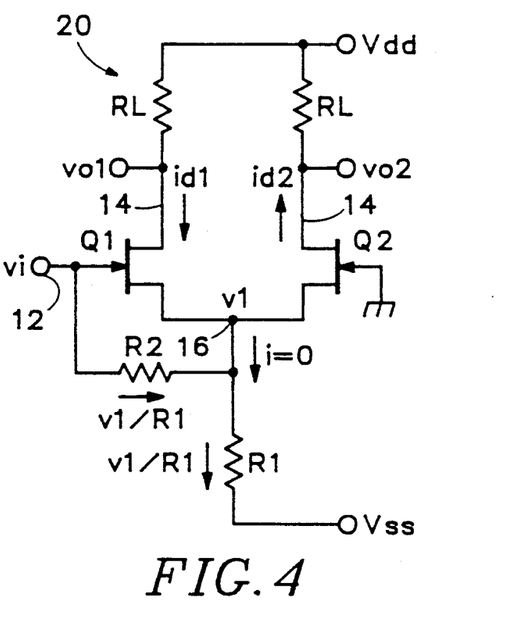

FIG. 3 shows the biasing for amplifier 20 provided by a biasing resistor R1, and FIG. 4 shows that the corresponding compensation network 23 is provided by a resistor R2. To cancel the signal tail current and provide a balanced differential output, the value of R2 is chosen to be substantially equal to the value of R1.

Figure 5:
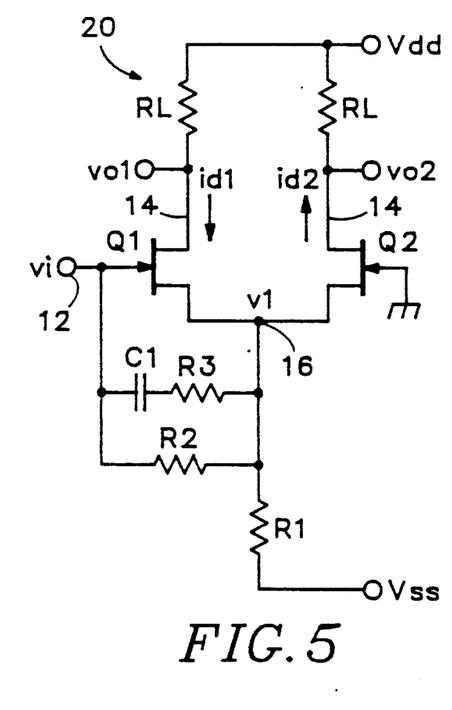

The problem of an unbalanced differential amplifier typically increases with frequency due to transistor parasitic impedances. Thus, it may be desirable in some applications to make the compensation network frequency dependent. FIG. 5 shows the tail current being provided by bias resistor R1. The corresponding compensation impedance is provided by resistor R2 in parallel combination with the series combination of capacitor C1 and resistor R3. The compensation current increases with frequency over a predetermined band since the voltage across the compensation impedance is approximately constant while the total value of the compensation impedance decreases with frequency over a predetermined band. To cancel the signal tail current and provide a balanced differential output, the value of R2 is chosen to be substantially equal to the value of R1 at lower operating frequencies. At higher operating frequencies, the values of C1 and R3 are chosen to provide additional cancellation current, but the exact values are determined primarily by the type of transistors (Q1, Q2) used and the parasitic impedance connected to the bias terminal 16. Computer simulations confirm that a value of capacitor C1 and resistor R3 can be chosen such that balance is maintained at frequencies higher than is possible with R1 alone. This technique can also be used to affect the phase relationship between vo1 and vo2.

Figure 6:
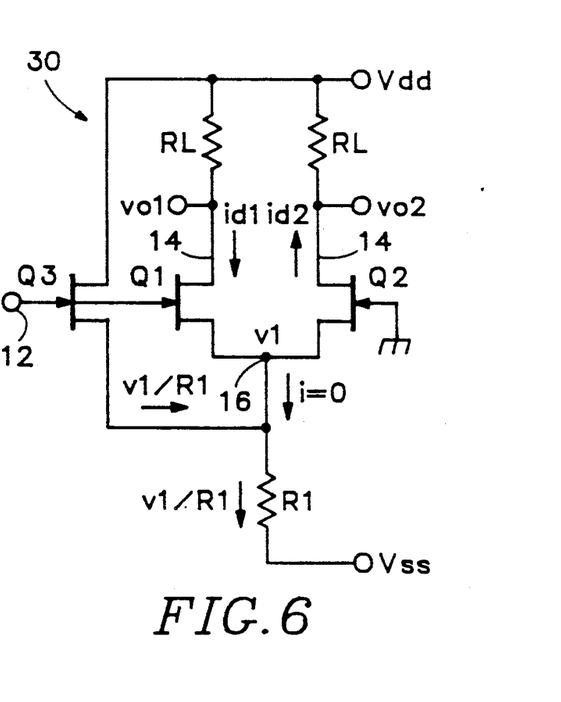

FIG. 6 shows an amplifier 30 in which the cancellation current is provided by transistor Q3, configured as a source follower. The gate of transistor Q3 is coupled to the single-ended voltage input 12 of the differential stage, the drain is coupled to the positive voltage supply Vdd, and the source of transistor Q3 is coupled to the bias terminal 16 of the differential stage. For cancellation of the signal tail current to occur, the transconductance of transistor Q3 must be substantially equal to 1/R1. The value of the transconductance of transistor Q3 is typically set by choosing the appropriate bias current and channel width and length of the transistor as is known in the art.

Figure 7:
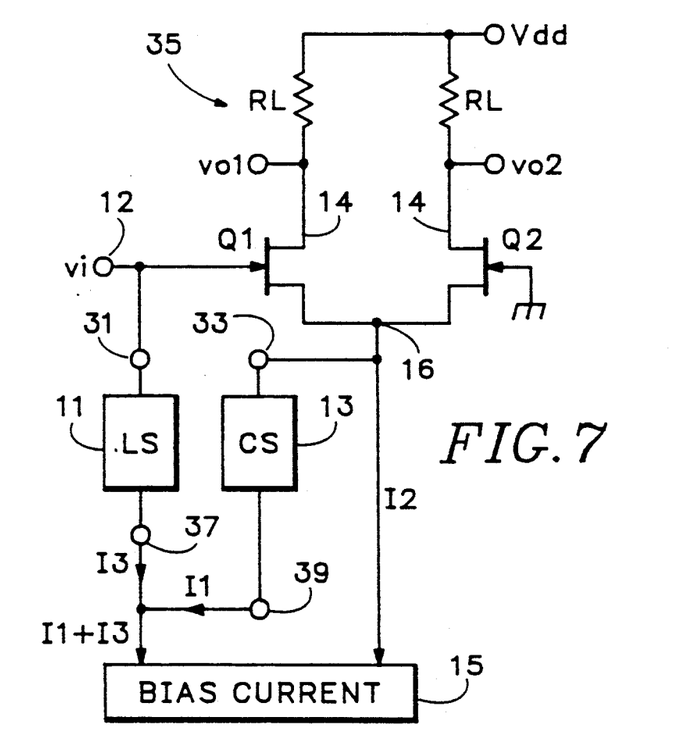

Cancellation of the signal tail current can be provided by a current source 13 as shown in amplifier 35 of FIG. 7. The bias currents I1, I2, and I3 are provided by bias current supplying means 15. Typically, the bias current supplying means includes two or more separate current sources, a multiple output current source, or other bias circuitry. The total bias current for the differential stage (Q1, Q2) is equal to I1+I2. The output 33 from the current source 13 is coupled to the bias terminal 16 of the differential stage to provide both bias and signal cancelling current. The bias terminal 39 of current source 13 is coupled to the bias current supplying means 15. A level shifting circuit 11 with output 37 provides the proper biasing voltage across current source 13. The level shifting circuit 11 also receives its bias current from bias current supplying means 15. Thus the input 31 of the level shifting circuit is coupled to the single-ended voltage input 12 and the output 37 is coupled to the bias current supplying means 15. Typically, the level shifting circuit 11 may comprise a plurality of diodes or resistors or circuits for level shifting as are well known in the art. The current source 13 may comprise a single transistor wherein the drain forms the output and the coupled gate and source form the bias terminal. Alternatively, the current source 13 may comprise any three terminal current source known in the art having an input, an output, and a bias terminal. Although not shown in FIG. 7, the input of such a current source is coupled to a reference current or can be coupled to an appropriate biasing terminal within the level shifting circuit 11. The operation of amplifier 35 is made clear in the subsequent embodiments using this general configuration.

Figure 8:
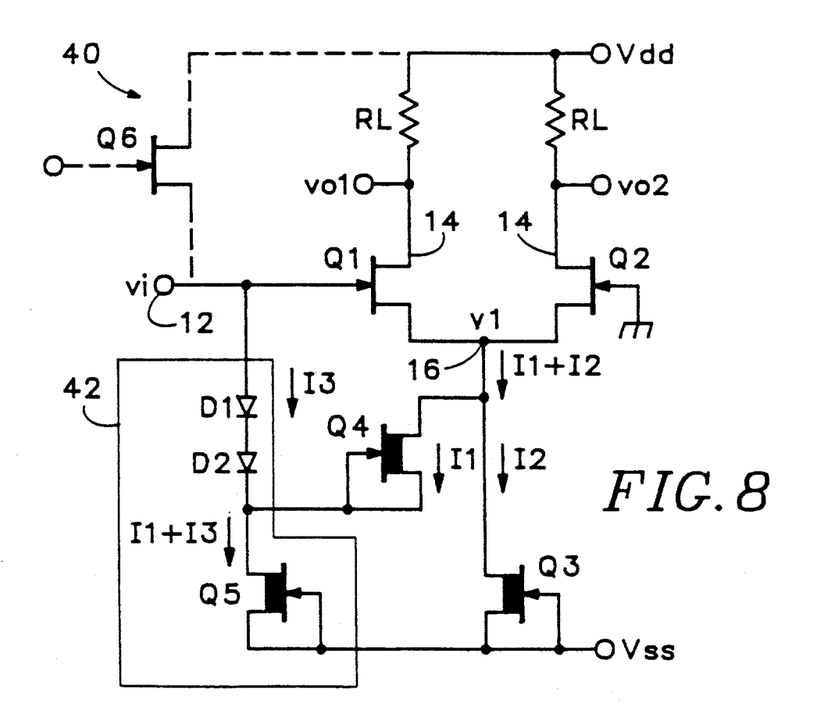

Biasing for the differential stage can be provided by current source transistors Q3 and Q4 as shown in amplifier 40 of FIG. 8. The gate and source of current source transistor Q3 are coupled to the negative supply voltage, Vss, to set a bias current I2 equal to the drain saturation current, Idss, of the transistor. The drain of transistor Q3 is coupled to the bias terminal 16 of the differential stage (Q1, Q2). The cancellation current is provided by current source transistor Q4. The gate and source of transistor Q4 are coupled together to set a bias current I1 equal to the drain saturation current, Idss, of the transistor. The gate and source of transistor Q4 are coupled to the single-ended voltage input of the differential stage 12 through diodes D1 and D2. The drain of transistor Q4 is coupled to the bias terminal 16 of the differential stage. Thus, transistors Q3 and Q4 are both configured as current sources for biasing the differential stage with a total bias current of I1+I2. Currents I1 and I2 are substantially equal. The size of transistors Q3 and Q4 as well as their associated drain-to-source impedances are also substantially equal. However, the signal tail current that results from the modulation of voltage across the incremental output impedance of transistor current source Q3 is substantially cancelled by the corresponding signal current provided by the modulation of voltage across the incremental output impedance of transistor current source Q4.

Diodes D1 and D2 and current source transistor Q5 comprise a level shifting circuit 42. The level shifting voltage of two diode drops is interposed between the single-ended voltage input of the differential stage 12 and the coupled gate and source of transistor Q4. Bias current for diodes D1 and D2 is provided by current source Q5. The level shifting circuit 42 may be necessary since the voltage from the gate to source of transistor Q1 is typically insufficient to bias current source transistor Q4. For example, in certain GaAs transistors, a gate to source voltage is typically plus or minus 100 millivolts, whereas the minimum drain to source voltage required is one volt. An optional source follower transistor Q6 is shown that may be used to absorb bias current I3 and to drive the gate of transistor Q1.

Figure 9:
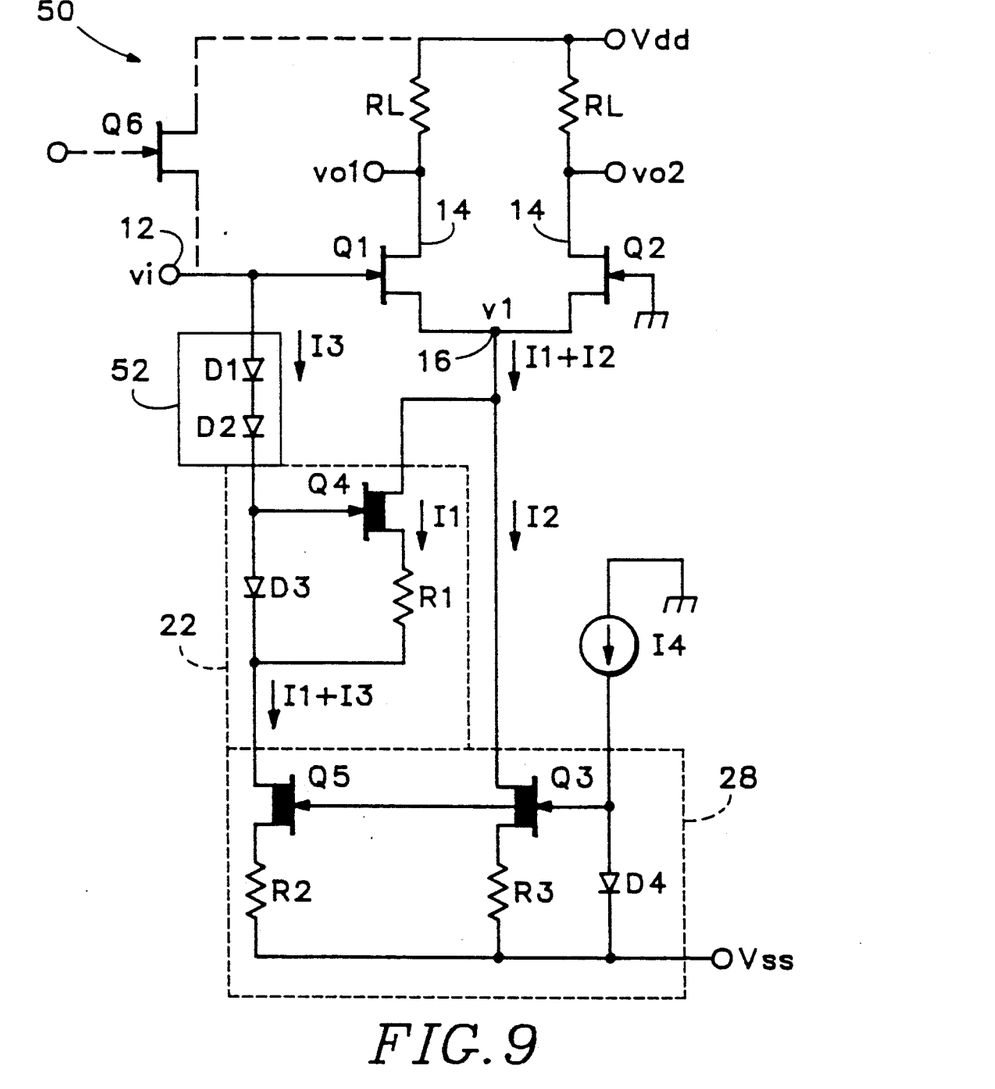

Biasing for the differential stage can also be provided by a multiple output resistor type current source 28 as shown in amplifier 50 of FIG. 9. Resistor type current sources typically have an input for receiving a reference current, a current output, and a bias terminal. A bias tail current I2 is supplied by transistor Q3 having a drain forming one output of the current source 28 that is coupled to the bias terminal 16 of the differential stage. A diode D4 has an anode coupled to the gate of transistor Q3 to form the input for receiving the reference current 14 and a cathode forming the bias terminal that is coupled to the negative supply voltage, Vss. A resistor R3 is coupled between the source of transistor Q3 and Vss. Thus, the voltage across diode D4 minus the gate to source voltage of Q3 is impressed across current setting resistor R3 to generate the bias tail current I2. The resistor type current source further includes an additional bias current I1+I3 that is provided by transistor Q5, current setting resistor R2, and common biasing diode D4.

The cancellation current is provided by another resistor type current source 22 including transistor Q4 having a gate coupled to the single-ended voltage input 12 of the differential stage, and a drain coupled to the bias terminal 16 of the differential stage. A diode D3 has an anode coupled to the gate of transistor Q4 and a cathode for receiving the additional bias current I3. A current setting resistor R1 is coupled between the source of transistor Q4 and cathode of diode D3. Thus, two resistor type current sources 22 and 28 provide biasing for the differential stage with a total bias current of I1+I2. Currents I1 and I2 are substantially equal as are the size of transistors Q3 and Q4 and the values of resistors R1 and R3. Therefore, the incremental impedances provided by resistor type current sources 28 and 22 are substantially equal. It is important to note that the incremental voltage at the input of a resistor type current source appears at the bias terminal since the diode presents a low incremental impedance. Thus, the signal tail current provided by the modulation of the voltage across the incremental output impedance of current source 28 is substantially cancelled by the corresponding current provided by the modulation of the voltage across the incremental output impedance of current source 22.

Diodes D1 and D2 and current source transistor Q5 comprise a level shifting circuit 52. The level shifting voltage of two diode drops is interposed between the single-ended voltage input of the differential stage 12 and the gate of transistor Q4. Therefore the input voltage vi is substantially coupled to the bias terminal of resistor type current source 22 to provide the correct compensation current. Bias current for diodes D1 and D2 is provided by current source transistor Q5. As in the embodiment of FIG. 8, an optional source follower transistor Q6 is shown that may be used to absorb bias current I1 and to drive the gate of transistor Q1.

Figure 10:
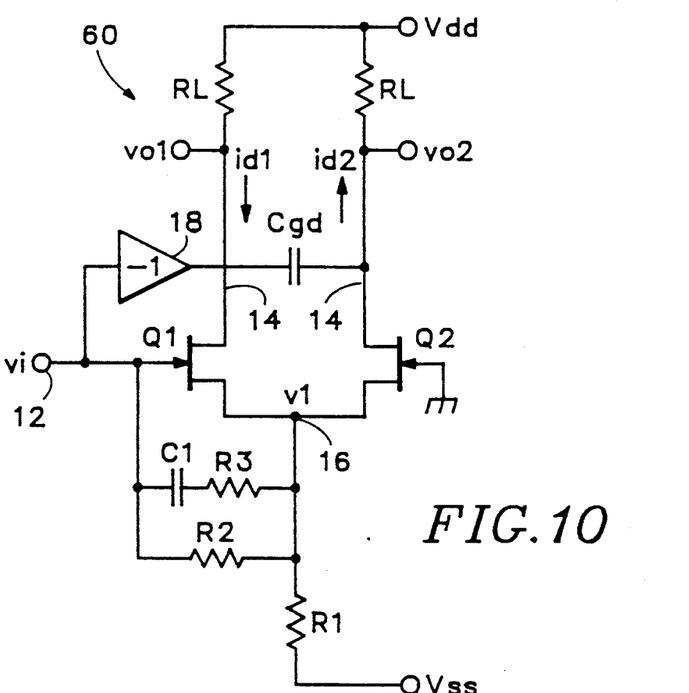

An amplifier 60 having improved balance at high frequencies is shown in FIG. 10 that further corrects for phase errors in addition to the errors in magnitude corrected by the amplifier shown in FIG. 5. The amplifier further includes a unity gain inverting voltage amplifier 18 having an input coupled to the single-ended voltage input 12 of the differential stage and an output coupled to a capacitor Cgd. The capacitor Cgd is coupled between the output of the unity gain inverting amplifier 18 and the drain of transistor Q2. For optimum phase correction, the value of capacitor Cgd is chosen to be substantially equal to the value of the parasitic capacitance Cgd of transistor Q1. To understand the operation of the amplifier 60 of FIG. 10, it is important to note that a parasitic capacitor Cgd couples the single-ended voltage from the gate to the drain of Q1. The parasitic capacitor on the drain of transistor Q2 is coupled to ground. Thus, capacitor Cgd couples the antiphase signal from the single-ended voltage to the drain of transistor Q2 to restore the proper phase relationship. For even more critical applications it may be desirable to couple an additional capacitor Cgd from the drain of transistor Q1 to ground to match the parasitic capacitance of the drain of transistor Q2.

Figure 11:
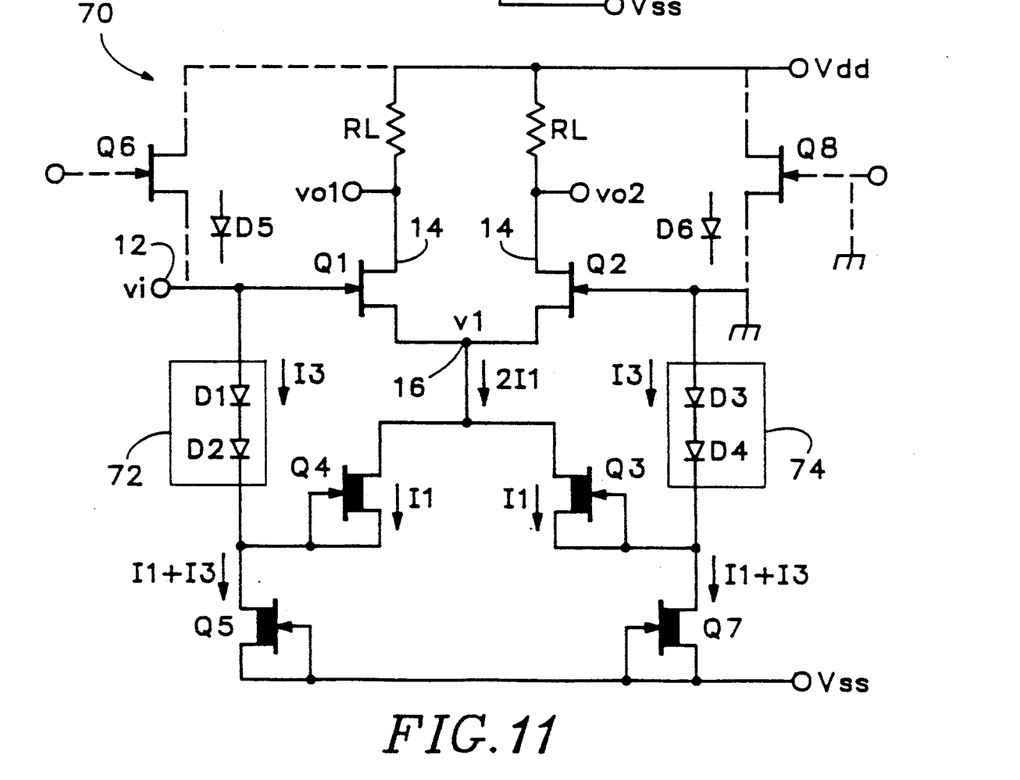

Depending upon the semiconductor process used, the drain current of a transistor, Id, may be highly sensitive to the drain-to-source voltage, Vds, of that transistor. An amplifier 70 with improved current source Vds matching over the embodiment of FIG. 7 is shown in FIG. 11. In this embodiment, transistor Q3 is not coupled to Vss but rather to a level shifting circuit 74 that includes diodes D3 and D4 and current source transistor Q7 that matches the corresponding level shifting circuit 72. Current source transistor Q7 provides a bias current I1+I3 that is used to bias current source transistor Q3 and diodes D3 and D4. In this manner, the currents flowing through transistors Q3 and Q4 as well as the respective drain-to-source voltages are the same. The total bias tail current for the differential stage (Q1, Q2) is equal to 2I1. The cancellation of the bias signal current is substantially the same as described in the embodiment of FIG. 7. However, the cancellation and resulting balanced differential output will be improved since transistors Q3 and Q4 have the same incremental output impedance. Optional source follower transistor Q6 and level shifting diode D5 are shown if it is desired to have a high impedance input. If these additional circuit elements are used, corresponding transistor Q8 and diode D6 may be used to further improve balance.

Figure 12:
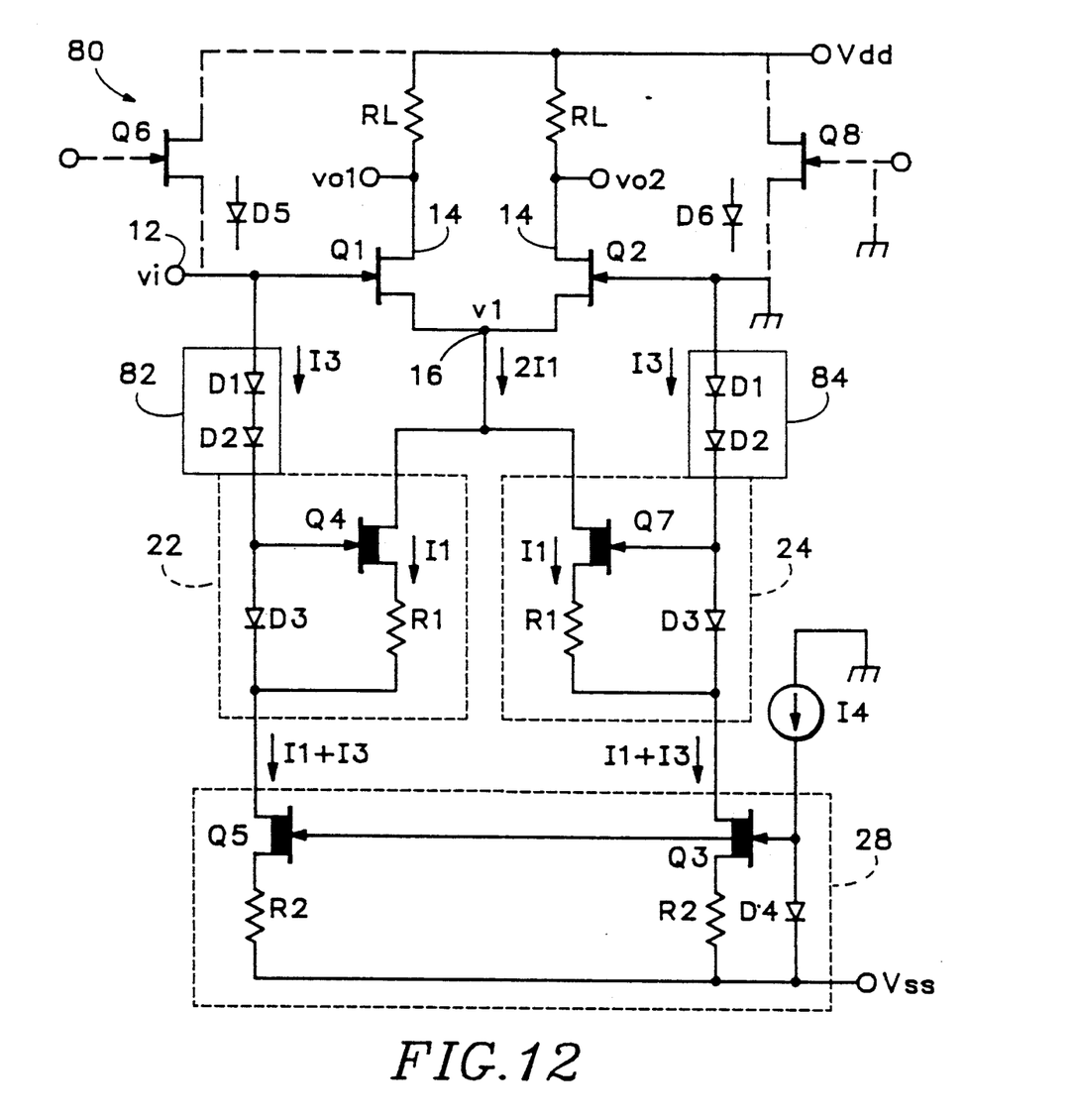

An amplifier 80 with improved current source Vds matching over the embodiment of FIG. 9 is shown in FIG. 12. In this embodiment, an additional resistor type current source 24 is interposed into the drain of transistor Q3. The additional resistor type current source 24 includes transistor Q7, diode D3 and current setting resistor R1. The currents flowing through current source transistors Q3 and Q5 are both set to I1+I3. An additional level shifting circuit 84 matches level shifting circuit 82 to make the drain-to-source voltages of current source transistors Q4 and Q7 the same. The total bias tail current for the differential stage (Q1, Q2) is equal to 2I1. The cancellation of the bias signal current is substantially the same as described in the embodiment of FIG. 9. However, the cancellation and resulting balanced differential output will be improved since transistors Q4 and Q7 have nearly equal incremental output impedance due to equal drain-to-source voltages. As in the previous embodiment, optional source follower transistor Q6 and level shifting diode D5 are shown if it is desired to have a high impedance input. If these additional circuit elements are used, corresponding transistor Q8 and diode D6 may be used to further improve balance.

Figure 13:
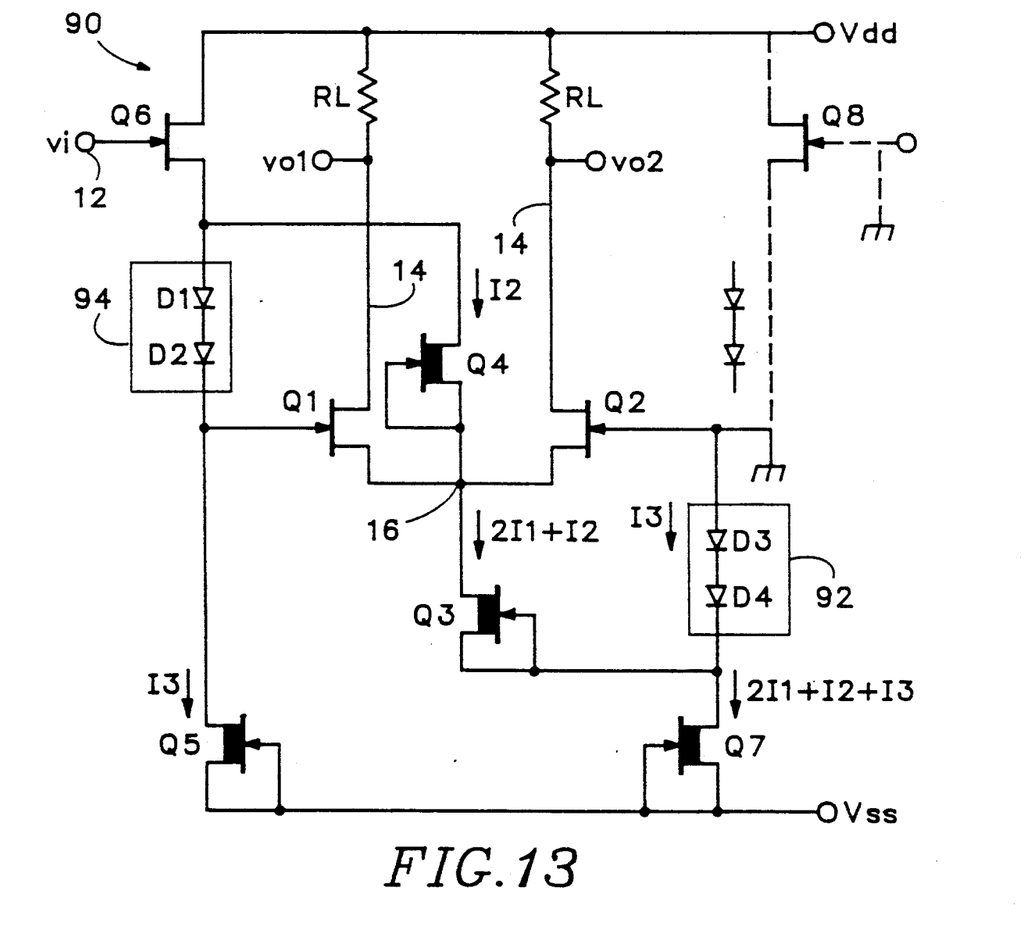

Another alternative embodiment 90 of an amplifier using the compensation apparatus of the present invention is shown in FIG. 13. The bias tail current is supplied to the differential stage by current source transistors Q3 and Q4 having a value of 2I1. Current source transistor Q3 provides a current equal to 2I1+I2 and current source transistor Q4 provides a current equal to I2. A level shift circuit 92 includes diodes D3 and D4 receives the remaining bias current equal to I3 and provides the necessary drain-to-source bias voltage for transistor Q4. The cancellation current is provided by current source transistor Q4. Transistor current source Q5 provides a bias current of I3 to level shifting diodes D1 and D2, as well as input transistor Q6. Diodes D1 and D2 of level shifting circuit 94 are necessary to provide the proper bias voltage for transistor Q4. The incremental output impedance of transistor Q3 provides a signal tail current that is cancelled by the signal current contribution of the incremental output impedance of transistor Q4 in the manner previously described. Optional transistor Q8 and level shifting diodes are shown to further improve balance.

The present invention is not limited by the use of transistors of any one type of semiconductor process. Although the balance apparatus and technique of the present invention is ideally suited to short channel FETs such as those used in GaAs MESFET semiconductor processes, it is not limited to GaAs. For example, improvements will be found using silicon MOSFETs, GaAs MODFETs, GaAs bipolar transistors, or in any type of process using low value resistors as biasing circuits. Although bipolar transistors and long channel MOSFETS typically have high output impedance when used as biasing elements, some benefit will still be derived in applications where exacting balance specifications are required. Furthermore, the addition of frequency dependent elements will maintain this balance at higher frequencies.

Figure 14:
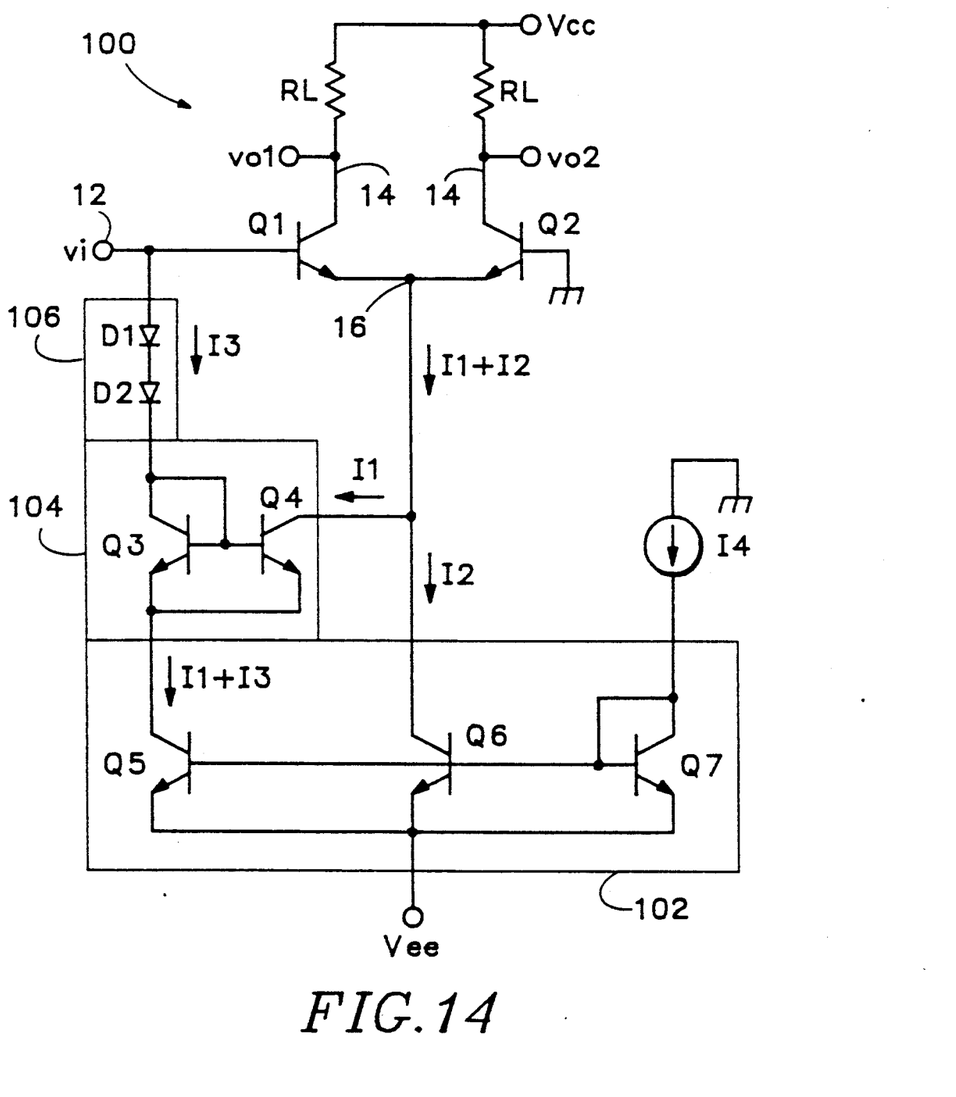

For example a circuit using silicon bipolar transistors is shown in FIG. 14 that is generally an adaptation of the FET circuit shown in FIG 8. A first current mirror 102 includes transistors Q5, Q6, and Q7 to provide output currents I1+I3 and I2 in response to reference current I4. A second current mirror 104 includes transistors Q3 and Q4 having an output current of I1 in response to reference current I3. A level shifting circuit 106 includes diodes D1 and D2 for maintaining proper bias voltage across transistor Q4. The operation of the circuit is similar to that described for the embodiment of FIG. 8, with the exception that the current mirrors have been reconfigured for use with bipolar transistors.

Having illustrated and described the principles of our invention in a preferred embodiment thereof, it should be readily apparent to those skilled in the art that the invention can be modified in arrangement and detail without departing from such principles. For example, although the circuit of the present invention is ideally suited for use in integrated circuits, it can also be fabricated in hybrid or discrete form. Furthermore, typical circuit element values can be modified as required for optimum performance. We claim all modifications coming within the spirit and scope of the accompanying claims.

We claim:

1. A circuit for converting a single-ended voltage into a balanced differential current comprising:
   (a) a differential stage having a single-ended voltage input, a differential current output, and a bias terminal for receiving a bias tail current;
   (b) means for supplying a bias tail current coupled to the bias terminal of the differential stage, the supplying means having a finite output impedance and an associated signal tail current; and
   (c) means coupled between the single-ended voltage input and the bias terminal of the differential stage having an impedance substantially equal to the output impedance of the supplying means for cancelling the signal tail current supplied to the bias terminal of the differential stage.

2. A circuit as in claim 1 further comprising a pair of load resistors coupled to the differential current output of the differential stage for converting the differential current output to a differential voltage output.

3. A circuit as in claim 1 in which the supplying means comprises a first impedance having a predetermined value.

4. A circuit as in claim 3 in which the cancelling means comprises a second impedance having a value substantially equal to that of the first resistor.

5. A circuit as in claim 3 in which the cancelling means comprises a second impedance having a value substantially equal to that of the first impedance within a predetermined frequency band and a frequency dependent value above the band.

6. A circuit as in claim 3 in which the cancelling means comprises a transistor having a control terminal coupled to the single-ended voltage input of the differential stage and a controlled terminal coupled to the bias terminal of the differential stage.

7. A circuit as in claim 1 in which the supplying means further comprises means for supplying an additional bias current.

8. A circuit as in claim 7 in which the cancelling means comprises:
   (a) a current source having an output coupled to the bias terminal of the differential stage and a bias terminal for receiving a first portion of the additional bias current; and
   (b) level shifting means having an input coupled to the single-ended voltage input of the differential stage and an output coupled to the bias terminal of the current source for receiving a second portion of the additional bias current.

9. A circuit as in claim 1 in which the supplying means comprises a transistor having a first controlled terminal coupled to a source of supply voltage, a second controlled terminal coupled to the bias terminal of the differential stage, and a control terminal coupled to the first controlled terminal.

10. A circuit as in claim 9 in which the cancelling means comprises a transistor having a control terminal coupled to the single-ended voltage input of the differential stage, a first controlled terminal coupled to the control terminal, and a second controlled terminal coupled to the bias terminal of the differential stage.

11. A circuit as in claim 10 in which the cancelling means further comprises level shifting means interposed between the single-ended voltage input of the differential stage and the control terminal of the transistor.

12. A circuit as in claim 1 in which the supplying means comprises:
   (a) a transistor having a control terminal, a first controlled terminal, and a second controlled terminal coupled to the bias terminal of the differential stage;
   (b) a diode having a first terminal coupled to the control terminal of the transistor for receiving a reference current and a second terminal coupled to a source of supply voltage; and
   (c) a resistor coupled between the first controlled terminal of the transistor and the source of supply voltage.

13. A circuit as in claim 12 in which the supplying means further comprises means for supplying an additional bias tail current.

14. A circuit as in claim 13 in which the cancelling means comprises:

(a) a transistor having a control terminal coupled to the single-ended voltage input of the differential stage, a first controlled terminal, and a second controlled terminal coupled to the bias terminal of the differential stage;

(b) a diode having a first terminal coupled to the control terminal of the transistor and a second terminal for receiving the additional bias tail current; and (c) a resistor coupled between the first controlled terminal of the transistor and the second terminal of the diode.

15. A circuit as in claim 14 in which the cancelling means further comprises level shifting means interposed between the single-ended voltage input of the differential stage and the control terminal of the transistor.

16. A circuit as in claim 1 in which the differential stage differential current output comprises first and second single-ended outputs, the first single-ended output having an associated parasitic capacitance coupled to the single-ended input.

17. A circuit as in claim 16 further comprising:

(a) a unity gain inverting voltage amplifier having an input coupled to the single-ended voltage input of the differential stage and an output; and (b) a capacitor coupled between the output of the unity gain inverting voltage amplifier and the second single-ended output, the capacitor having a value substantially equal to the value of the parasitic capacitance.

18. A circuit as in claim 1 in which the supplying means comprises:

(a) a first transistor having a control terminal coupled to a first source of supply voltage, a first controlled terminal coupled to the control terminal, and a second controlled terminal;

(b) a second transistor having a control terminal coupled to the second controlled terminal of the first transistor, a first controlled terminal coupled to the control terminal, and a second controlled terminal coupled to the bias terminal of the differential stage; and (c) level shift means coupled between the second controlled terminal of the first transistor and a second source of supply voltage.

19. A circuit as in claim 18 in which the cancelling means comprises;

(a) a first transistor having a control terminal coupled to a first source of supply voltage, a first controlled terminal coupled to the control terminal, and a second controlled terminal;

(b) a second transistor having a control terminal coupled to the second controlled terminal of the first transistor, a first controlled terminal coupled to the control terminal, and a second controlled terminal coupled to the bias terminal of the differential stage; and (c) level shift means coupled between the second controlled terminal of the first transistor and the single-ended voltage input of the differential stage.

20. A circuit as in claim 1 in which the supplying means comprises:

(a) a first resistor type current source having an input for receiving a reference current, an output, and a bias terminal coupled to a first source of supply voltage;

(b) a second resistor type current source having an input, an output coupled to the bias terminal of the differential stage, and a bias terminal coupled to the output of the first resistor type current source; and (c) level shift means coupled between the input of the second resistor type current source and a second source of supply voltage.

21. A circuit as in claim 20 in which the supplying means further comprises means for supplying an additional bias tail current substantially equal to the bias tail current of the supplying means.

22. A circuit as in claim 21 in which the cancelling means comprises:

(a) a resistor type current source having an input, an output coupled to the bias terminal of the differential stage, and a bias terminal for receiving the additional bias tail current; and (b) level shift means coupled between the input of the second resistor type current source and the single-ended voltage input of the differential stage.

23. A circuit as in claim 1 in which the supplying means comprises:

(a) a first transistor having a control terminal coupled to a first source of supply voltage, a first controlled terminal coupled to the control terminal, and a second controlled terminal;

(b) a second transistor having a control terminal coupled to the second controlled terminal of the first transistor, a first controlled terminal coupled to the control terminal, and a second controlled terminal coupled to the bias terminal of the differential stage; and (c) level shift means coupled between the second controlled terminal of the first transistor and a second source of supply voltage.

24. A circuit as in claim 23 in which the cancelling means comprises:

(a) a first transistor having a control terminal coupled to the first source of supply voltage, a first controlled terminal coupled to the control terminal, and a second controlled terminal coupled to the single-ended voltage input of the differential stage;

(b) a second transistor having a control terminal for receiving the single-ended voltage, and a first controlled terminal;

(c) level shift means coupled between the first controlled terminal of the second transistor and the single-ended voltage input of the differential stage; and (d) a third transistor having a control terminal coupled to the bias terminal of the differential stage, a first controlled terminal coupled to the control terminal, and a second controlled terminal coupled to the first controlled terminal of the second transistor.

25. A circuit as in claim 1 in which one of the supplying means and cancelling means comprise at least one transistor biased in the active region for respectively providing the bias tail current to the differential stage and providing the corresponding cancelling current thereto.

26. A circuit as in claim 25 in which the transistor is a GaAs MESFET.

27. A circuit as in claim 25 in which the transistor is a silicon MOSFET.

28. A circuit as in claim 25 in which the transistor is a silicon bipolar transistor.

29. A circuit as in claim 25 in which the transistor is a GaAs MODFET.

30. A circuit as in claim 25 in which the transistor is a GaAs bipolar transistor.

31. A circuit as in claim 25 in which the transistor is fabricated in an integrated circuit.

32. A method for converting an unbalanced differential current into a balanced differential current, the method comprising:
providing a differential stage having a single-ended voltage input, a differential current output, and a bias terminal;
coupling a first impedance to the bias terminal to supply bias current and an associated undesirable signal tail current to the differential stage; and
providing a compensating signal current to the bias terminal that is substantially equal to the signal tail current, thereby cancelling the signal tail current flowing through the differential stage and providing a balanced differential output current.

33. A method as in claim 32 in which the step of providing a compensating signal current comprises coupling means between the single-ended voltage input and the bias terminal of the differential stage having a second impedance substantially equal to the first impedance for cancelling the signal tail current supplied to the differential stage.

34. A method as in claim 33 further comprising the step of AC coupling the cancelling means between the single-ended voltage input and the bias terminal of the differential stage.

35. A method as in claim 33 in which the step of providing a compensating signal current comprises providing a compensating signal current for cancelling the signal tail current within a first frequency band and a frequency dependent compensating signal current within a second frequency band.

* * * * *